(12) United States Patent
Lee et al.

(10) Patent No.: US 11,165,008 B2
(45) Date of Patent: Nov. 2, 2021

(54) THERMOELECTRIC MODULE

(71) Applicants: Hyundai Motor Company, Seoul (KR); Kia Motors Corporation, Seoul (KR)

(72) Inventors: Min Jae Lee, Seoul (KR); Jin Woo Kwak, Suwon-si (KR); Woo Ju Lee, Seoul (KR); Byung Wook Kim, Seongnam-si (KR); Hoo Dam Lee, Seongnam-si (KR); Na Kyong Yun, Suwon-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 13 days.

(21) Appl. No.: 16/857,830

(22) Filed: Apr. 24, 2020

(65) Prior Publication Data

US 2021/0175404 A1 Jun. 10, 2021

(30) Foreign Application Priority Data

Dec. 10, 2019 (KR) .................. 10-2019-0163768

(51) Int. Cl.
*H01L 35/32* (2006.01)
*B60H 1/00* (2006.01)
*H01L 35/10* (2006.01)

(52) U.S. Cl.
CPC .......... *H01L 35/32* (2013.01); *B60H 1/00285* (2013.01); *H01L 35/10* (2013.01)

(58) Field of Classification Search
CPC ...... H01L 35/10; H01L 35/32; B60H 1/00285
See application file for complete search history.

(56) References Cited

U.S. PATENT DOCUMENTS

| | | | |
|---|---|---|---|
| 2013/0008181 A1* | 1/2013 | Makansi | F25B 21/04 62/3.3 |
| 2016/0056360 A1* | 2/2016 | Cho | H01L 35/34 136/205 |
| 2018/0358529 A1* | 12/2018 | Sottong | H01L 35/32 |

FOREIGN PATENT DOCUMENTS

| | | |
|---|---|---|
| JP | 2008288535 A | 11/2008 |
| KR | 101493797 B1 | 2/2015 |
| WO | 2017074002 A1 | 5/2017 |

* cited by examiner

*Primary Examiner* — Matthew T Martin
(74) *Attorney, Agent, or Firm* — Slater Matsil, LLP

(57) ABSTRACT

A thermoelectric module includes a first thermoelectric material, a second thermoelectric material spaced apart from the first thermoelectric material, and a stretching element selectively connected between the first thermoelectric material and the second thermoelectric material, wherein the stretching element is stretchable.

20 Claims, 9 Drawing Sheets

THERMOELECTRIC MODULE

CROSS-REFERENCE TO RELATED APPLICATIONS

This application claims priority to Korean Patent Application No. 10-2019-0163768, filed in the Korean Intellectual Property Office on Dec. 10, 2019, which application is hereby incorporated herein by reference.

TECHNICAL FIELD

The present disclosure relates to a thermoelectric module.

BACKGROUND

A thermoelectric module based on an air conditioner, which controls a temperature through a temperature of air, consumes a lot of energy and takes much time for a user to experience temperature changes. Therefore, it is difficult to improve temperature control efficiency and energy efficiency more than a certain level.

Recently, a temperature control system of a method of directly contacting a thermoelectric module, which is capable of heating and cooling, has been developed.

In general, the thermoelectric module is manufactured by connecting an electrode to a P-type thermoelectric material and an N-type thermoelectric material on a substrate to have low heat loss and to rapidly control the temperature.

However, a conventional thermoelectric module (e.g., a bulk type thermoelectric element) is hard and difficult to be bent, is difficult to mount on a subject having a large bend due to characteristics difficult to stretch, and is constrained in mounting location and mounting area.

In addition, the conventional thermoelectric module is difficult to stretch in response to an external pressure and when the pressure is applied from the outside, an electrode connected to a thermoelectric material is damaged or broken in the conventional thermoelectric module.

Accordingly, recently, various studies have been made to improve flexibility and elasticity of the thermoelectric module, but there is still a need for development thereof.

SUMMARY

The present disclosure has been made to solve problems occurring in the prior art while advantages achieved by the prior art are maintained intact.

The present disclosure relates to a thermoelectric module. Particular embodiments relate to a thermoelectric module capable of improving flexibility and elasticity.

An embodiment of the present disclosure provides a thermoelectric module which is capable of improving flexibility and elasticity.

For example, a thermoelectric module according to an embodiment of the present disclosure is able to bend or stretch freely in response to an external pressure.

In addition, a thermoelectric module according to an embodiment of the present disclosure can improve stability, reliability and durability.

In addition, a thermoelectric module according to an embodiment of the present disclosure is able to operate in response to an external pressure.

In addition, a thermoelectric module according to an embodiment of the present disclosure can improve temperature control efficiency and energy efficiency.

Technical problems to be solved by the present inventive concept are not limited to the aforementioned problems, and any other technical problems not mentioned herein will be clearly understood from the following description by those skilled in the art to which the present disclosure pertains.

According to an embodiment of the present disclosure, a thermoelectric module includes a first thermoelectric material, a second thermoelectric material spaced apart from the first thermoelectric material, and a stretching element, which is stretchable and selectively connected between the first thermoelectric material and the second thermoelectric material.

This is to improve flexibility and elasticity of the thermoelectric module.

Namely, the conventional thermoelectric module (e.g., a bulk type thermoelectric element) has characteristics of being hard, hard to bend and hard to stretch, and thus there is a problem in that it is difficult to be mounted on a large curve subject and mounting position and mounting area are restricted. Furthermore, when the pressure is applied from the outside, an electrode connected to a thermoelectric material is damaged or broken in the conventional thermoelectric module.

However, in embodiments of the present disclosure, the first thermoelectric material and the second thermoelectric material may be connected to each other via the stretching element, thereby improving the flexibility and elasticity of the thermoelectric module.

First of all, embodiments of the present disclosure allow the first thermoelectric material and the second thermoelectric material to be connected to each other through the stretching element, and thus the thermoelectric module has elasticity as well as flexibility along x-axis, y-axis, and z-axis directions. Therefore, a degree of freedom (q flexion degree of freedom) of the thermoelectric module may be increased and the thermoelectric module may be easily mounted regardless of the bending degree of a subject.

Preferably, the thermoelectric module further includes a first frame member in which the first thermoelectric material is accommodated, and a second frame member in which the second thermoelectric material is accommodated. The stretching element is stretchably disposed between the first frame member and the second frame member, one end is connected to the first frame member, and the other end is connected to the second frame member.

According to an embodiment of the present disclosure, a helical spring member may be used as the stretching element.

Preferably, the helical spring member is formed in a unitary unit with the first frame member and the second frame member.

As an example, the first frame member, the second frame member, and the helical spring member may be formed by 3D printing to be formed in a unitary unit. As above-described, the first frame member, the second frame member, and the helical spring member may be formed by 3D printing, and thus may achieve the advantageous effects of simplifying a manufacturing process and enlarging the thermoelectric module.

More preferably, the helical spring member is formed of the same non-conductive elastic material as the first frame member and the second frame member.

In addition, the thermoelectric module further includes an electrode member electrically connecting one end of the first thermoelectric material to one end of the second thermoelectric material.

Preferably, the electrode member is provided to be stretchable between the first thermoelectric material and the second thermoelectric material.

The electrode member may be formed in various structures having elasticity, and the present disclosure is not limited or restricted by the structure of the electrode member.

As an example, the electrode member includes a wire-shaped crest portion and a wire-shaped trough portion connected to the wire-shaped crest portion to form a continuous waveform with the wire-shaped crest portion.

As above-described, bending, torsion, and expansion of the second thermoelectric material with respect to the first thermoelectric material may be allowed, and the electrode member may be allowed to have stretchable flexibility to improve the elasticity and flexibility of the thermoelectric module. Therefore, damage and breakage of the electrode member due to a relative movement of the second thermoelectric material with respect to the first thermoelectric material may be minimized and durability may be improved.

According to an embodiment of the present disclosure, the thermoelectric module further includes a piezoresistive pressure sensor connecting the other end of the first thermoelectric material to the other end of the second thermoelectric material. In addition, when an external force is applied to the piezoresistive pressure sensor, the thermoelectric module is electrically connected to the first thermoelectric material and the second thermoelectric material through the piezoresistive pressure sensor.

This is to actively implement temperature control of the thermoelectric module without using an additional control unit.

Conventionally, as an entire area of the thermoelectric module is controlled to a uniform temperature by a control signal of a control unit regardless of whether or not a user's body is contacted, the temperature control is performed even in an area (e.g., a non-contact area where the body does not touch) which does not require actual temperature control, and thus there is a problem that heat loss inevitably occurs and unnecessary power consumption increases.

In addition, conventionally, an additional control unit for controlling the temperature of the thermoelectric module is provided, and thus there is a problem that a structure is complicated and a manufacturing cost is increased.

However, in the present disclosure, when the external force is applied to the piezoresistive pressure sensor, the thermoelectric module including the first thermoelectric material and the second thermoelectric material may be electrically connected and operated (heated or cooled) via the piezoresistive pressure sensor, and thus a control structure of the thermoelectric module may be simplified and the temperature of the thermoelectric module may be controlled without using an additional control unit.

In addition, in embodiments of the present disclosure, local temperature control of the thermoelectric module may be performed depending on a body shape and posture of a user, and thus heat loss may be minimized and power consumption may be significantly lowered.

Therefore, the temperature control of the thermoelectric module is not performed generally over the entire area, but the temperature control of only a specific area where actual contact depending on use environment (e.g., the user's body shape and posture) is made may be performed independently, and therefore the temperature control efficiency and the energy efficiency of the thermoelectric module may be improved.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF ILLUSTRATIVE EMBODIMENTS

Hereinafter, preferred embodiments of the present disclosure will be described in detail with reference to the accompanying drawings, but the present disclosure is not limited or restricted by the embodiments. For reference, in the present description, the same numbers refer to substantially the same elements, and may be described by referring to the contents described in the other drawings under these rules, and the contents determined to be obvious to those skilled in the art or repeated may be omitted.

Figure 1:
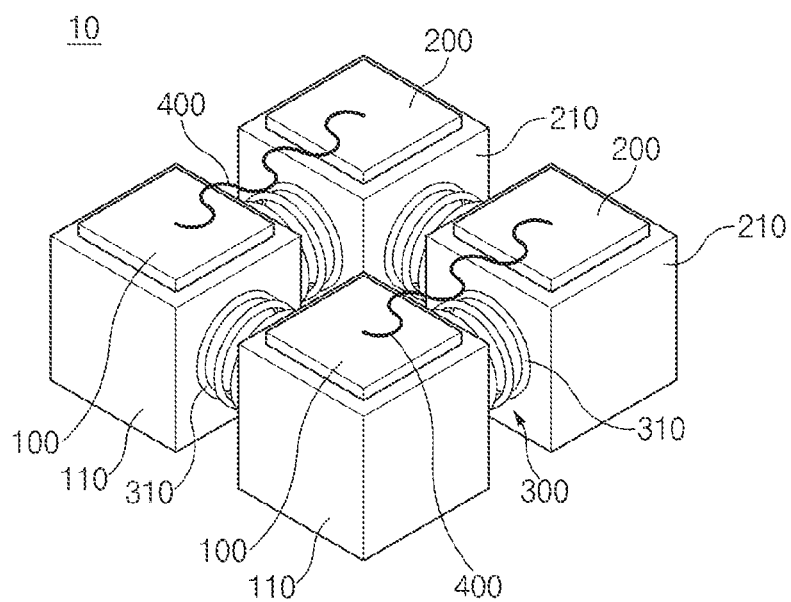
FIG. 1 is a view for illustrating a thermoelectric module according to embodiments of the present disclosure.
Figure 2:
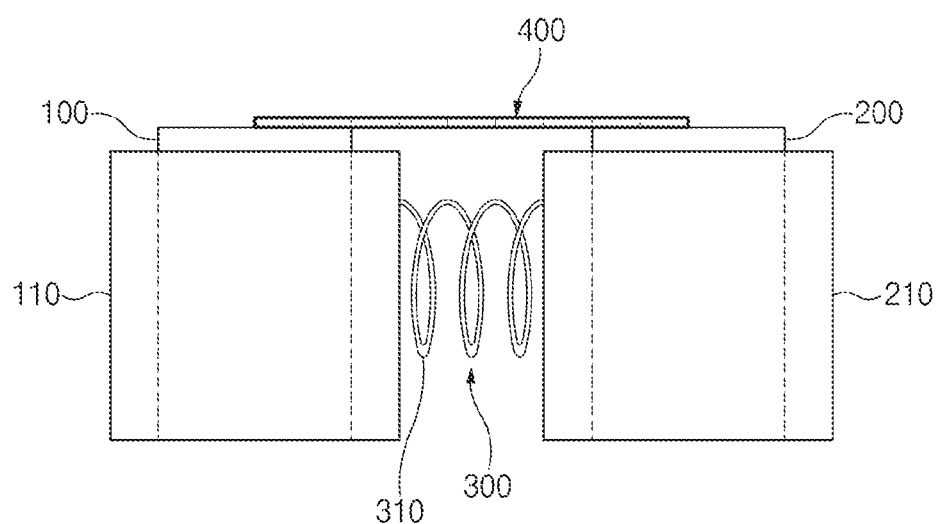
FIG. 2 is a side view for illustrating a thermoelectric module according to embodiments of the present disclosure.
Figure 3:
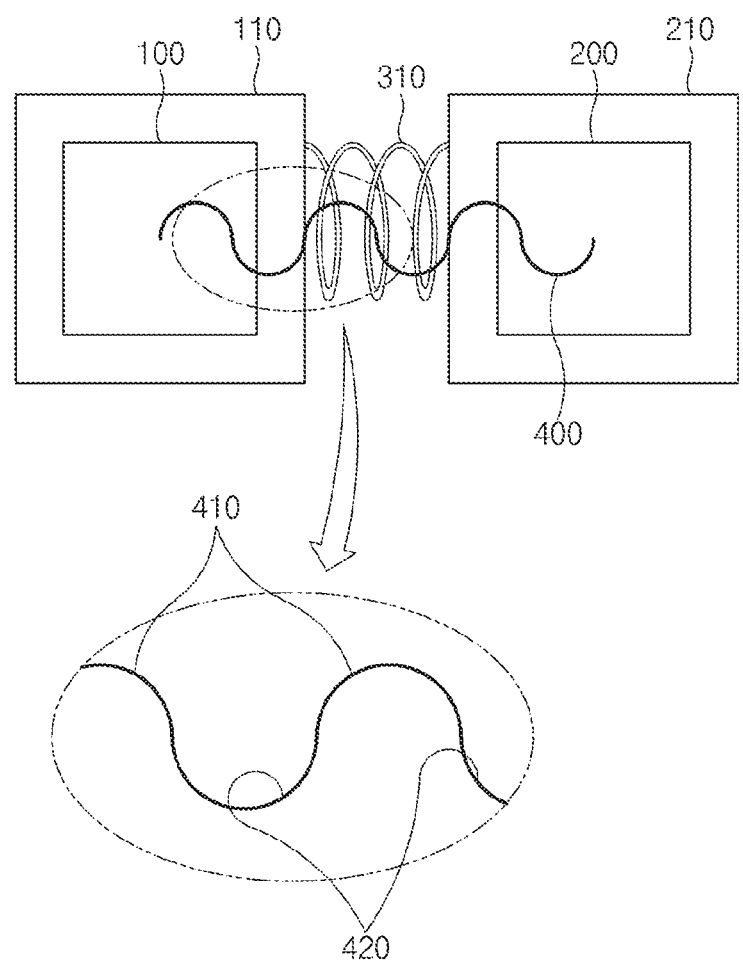
FIG. 3 is a plan view for illustrating a thermoelectric module according to embodiments of the present disclosure.
Figure 4:
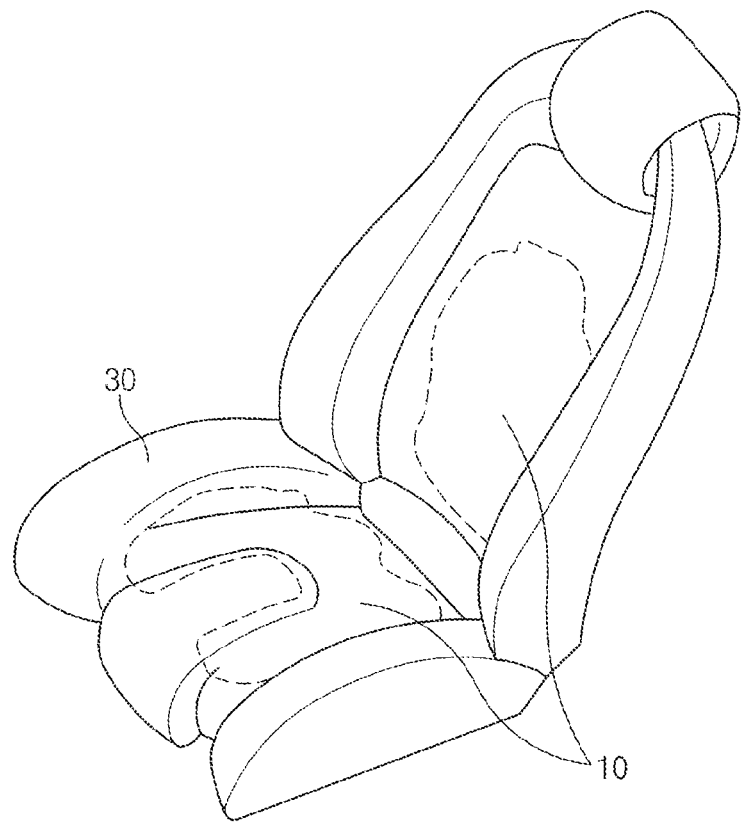
FIG. 4 is a view for illustrating a use example of a thermoelectric module according to embodiments of the present disclosure.
Figure 5:
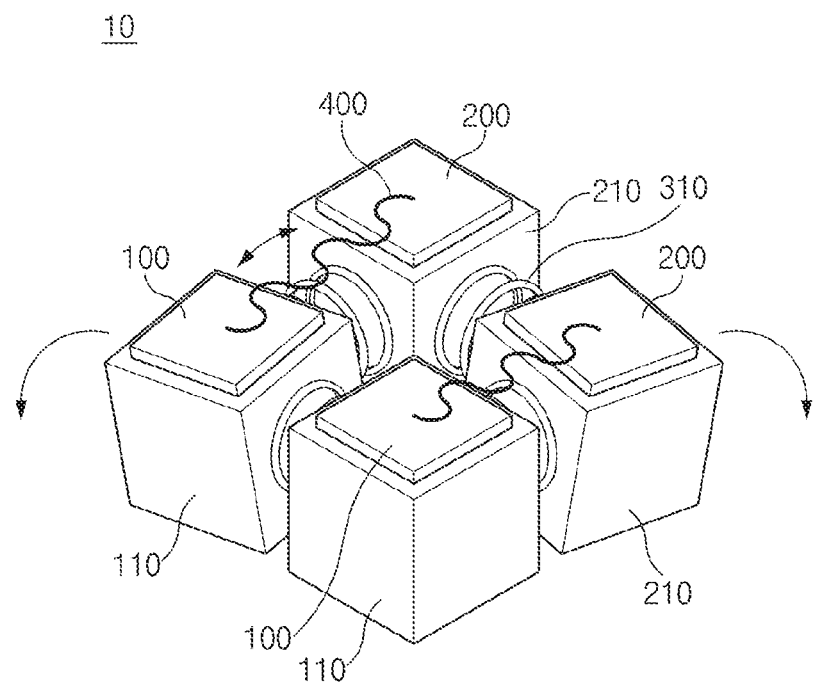
FIG. 5 is a view for illustrating a stretch state of a thermoelectric module according to embodiments of the present disclosure.
Figure 6:
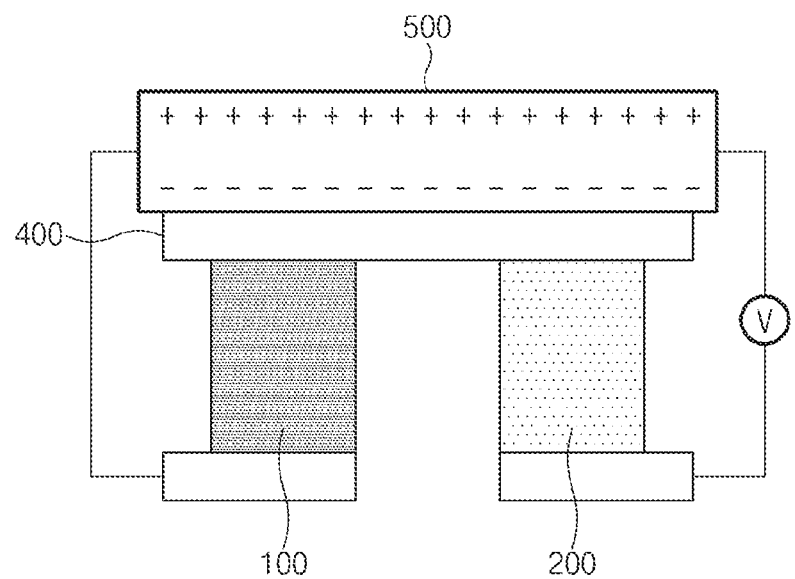
FIGS. 6 and 7 are views illustrating a piezoresistive pressure sensor as a thermoelectric module according to embodiments of the present disclosure.
Figure 7:
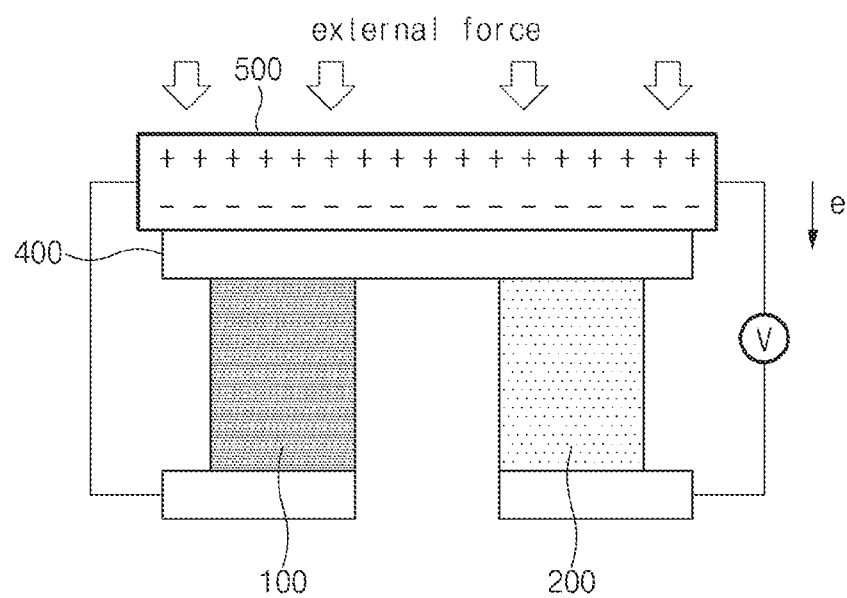

FIG. 1 is a view for illustrating a thermoelectric module according to embodiments of the present disclosure, FIG. 2 is a side view for illustrating a thermoelectric module according to embodiments of the present disclosure, and FIG. 3 is a plan view for illustrating a thermoelectric module according to embodiments of the present disclosure. In addition, FIG. 4 is a view for illustrating a use example of a thermoelectric module according to embodiments of the present disclosure, FIG. 5 is a view for illustrating a stretch state of a thermoelectric module according to embodiments of the present disclosure, and FIGS. 6 and 7 are views illustrating a piezoresistive pressure sensor as a thermoelectric module according to embodiments of the present disclosure.

Referring to FIGS. 1 to 5, a thermoelectric module 10 according to embodiments of the present disclosure includes a first thermoelectric material 100, a second thermoelectric material 200 disposed to be spaced apart from the first thermoelectric material 100, and a stretching element 300 which is selectively stretched and connected between the first thermoelectric material 100 and the second thermoelectric material 200.

For reference, the thermoelectric module 10 according to embodiments of the present disclosure may be mounted on a subject with which a body is in contact and the present disclosure is not limited or restricted by type and structure of the subject.

As an example, the thermoelectric module 10 according to embodiments of the present disclosure is mounted to a seat 30 of a vehicle and is configured to selectively be heated or cooled.

Here, mounting the thermoelectric module on the seat 30 of the vehicle is defined as including both mounting the thermoelectric module on an interior and an outer surface of the seat 30. For example, the thermoelectric module may be respectively mounted on a bottom seat (a hip seat) and a backrest seat, which constitute the seat 30.

According to another embodiment of the present disclosure, it is also possible that the thermoelectric module is mounted on a steering wheel or other part of the vehicle.

The first thermoelectric material 100 is an element for converting thermal energy and electrical energy and is referred to as terms such as a Peltier element, a thermoelectric cooler (TEC), and the like. The first thermoelectric material 100 is widely used as a cooling or heating means using a Peltier Effect, in which one side is heated and the other side is cooled when a current flows.

As an example, the first thermoelectric material boo is made of any one of an N-type thermoelectric material and a P-type thermoelectric material (e.g., the N-type thermoelectric material) and is arranged in a specific pattern on one surface (e.g., an upper surface) of a substrate (not shown).

An arrangement of the first thermoelectric material 100 may be changed in various ways depending on required conditions and design specifications. For example, the first thermoelectric material 100 may be arranged to form a specific matrix. Alternatively, a plurality of first thermoelectric materials may be arranged in a curve or other patterns and the present disclosure is not limited or restricted by the arrangement and structure of the first thermoelectric material.

The second thermoelectric material 200 is disposed to be spaced apart from the first thermoelectric material 100.

For example, the second thermoelectric material 200 may be made of the other one of the N-type thermoelectric material and the P-type thermoelectric material (e.g., the P-type thermoelectric material) and the first thermoelectric material 100 (e.g., the N-type thermoelectric material) and the second thermoelectric material 200 (e.g., the P-type thermoelectric material), which have opposite polarities to each other may constitute a unit thermoelectric material.

According to another embodiment of the present disclosure, the first thermoelectric material and the second thermoelectric material, which have the same polarity with each other, may be made of the N-type thermoelectric material (or the P-type thermoelectric material) and the first thermoelectric material and the second thermoelectric material may also constitute different unit thermoelectric materials.

For example, first ends (e.g., top ends) of the first thermoelectric material 100 and the second thermoelectric material 200 may be electrically connected by an electrode member 400 and second ends (e.g., bottom ends) of the first thermoelectric material 100 and the second thermoelectric material 200 may be connected to a power supply unit (not shown). In addition, as power is supplied from the power supply unit (not shown), the unit thermoelectric material including the first thermoelectric material 100 and the second thermoelectric material 200 is operated (e.g., heated).

At this case, the unit thermoelectric material including the first thermoelectric material 100 and the second thermoelectric material 200 may be provided in plural. A plurality of unit thermoelectric materials is capable of being connected in parallel or connected in series to the power supply unit.

In addition, a plurality of first thermoelectric materials 100 and a plurality of second thermoelectric materials 200 may be arranged in a specific matrix (e.g., a 2×2 matrix) to form a thermoelectric material group, which is connected to a power supply unit (not shown) in series or in parallel. In addition, number and arrangement of the first thermoelectric materials 100 and the second thermoelectric materials 200 may be variously changed based on required conditions and design specifications.

The stretching element 300 is selectively stretchably connected between the first thermoelectric material 100 and the second thermoelectric material 200.

The stretching element 300 may be formed in a structure which is capable of being selectively stretched to be connected to the first thermoelectric material 100 and the second thermoelectric material 200 and the present disclosure is not limited or restricted by the structure of the stretching element 300.

As above-described, the first thermoelectric material 100 and the second thermoelectric material 200 adjacent to each other may be connected to each other via the stretching element 300, and thus the thermoelectric module 10 may have flexibility and elasticity along an x-axis direction, a y-axis direction, and a z-axis direction.

That is, the conventional thermoelectric module 10 (e.g., a bulk type thermoelectric element) has characteristics of being hard, hard to bend and hard to stretch, and thus there is a problem in that it is difficult to be mounted on a large curve subject and mounting position and mounting area are restricted. In addition, the conventional thermoelectric module 10 is difficult to stretch in response to an external pressure and when the pressure is applied from the outside, an electrode connected to a thermoelectric material is damaged or broken in the conventional thermoelectric module.

However, in embodiments of the present disclosure, the first thermoelectric material 100 and the second thermoelectric material 200 adjacent to each other may be connected to each other via the stretching element 300 to allow the thermoelectric module 10 to have flexibility and elasticity. Therefore, a degree of freedom (flexion degree of freedom) of the thermoelectric module 10 may be increased and the thermoelectric module 10 may be easily mounted regardless of the curved degree of the subject.

Preferably, the thermoelectric module 10 includes a first frame member 110 in which the first thermoelectric material 100 is accommodated and a second frame member 210 in which the second thermoelectric material 200 is accommodated. The stretching element 300 is arranged to be stretchable between the first frame member 110 and the second frame member 210 and one end of the stretching element 300 is connected to the first frame member 110, and the other end of the stretching element 300 is connected to the second frame member 210.

As an example, the first frame member 110 is formed in a hollow case structure, which surrounds a circumference of the first thermoelectric material 100 and when the first thermoelectric material 100 is accommodated inside the first frame member 110, a top surface and a bottom surface of the first thermoelectric material 100 are exposed to the outside of the first frame member 110.

In addition, the second frame member 210 is formed in a hollow case structure, which surrounds a circumference of the second thermoelectric material 200, and when the second thermoelectric material 200 is accommodated inside the second frame member, a top surface and a bottom surface of the second thermoelectric material 200 are exposed to the outside of the second frame member 210.

Preferably, the first frame member 110 and the second frame member 210 are formed of a non-conductive elastic material having elasticity.

The stretching element 300 structurally connects the first frame member 110 to the second frame member 210 and is constituted to be stretched between the first frame member 110 and the second frame member 210 in response to a relative movement (e.g., a pressed movement or a twisted movement) of the second frame member 210 with respect to the first frame member 110.

As an example, a helical spring member 310 may be used as the stretching element 300.

The helical spring member 310 is formed in a form of a spiral spring, one end thereof is connected to an outer surface of the first frame member 110, and the other end thereof is connected to an outer surface of the second frame member 210.

Preferably, the helical spring member 310 is formed in a unitary unit with the first frame member 110 and the second frame member 210.

Here, forming the helical spring member 310 with the first frame member 110 and the second frame member 210 in the unitary unit is defined as integrally connecting the helical spring member 310, the first frame member 110, and the second frame member 210 to one another to form one component.

For example, the first frame member 110, the second frame member 210, and the helical spring member 310 may be integrally formed by 3D printing. As above-described, the first frame member 110, the second frame member 210, and the helical spring member 310 may be formed by 3D printing, and thus advantageous effects of simplifying a manufacturing process and enlarging the thermoelectric module 10 may be obtained.

Preferably, the helical spring member 310 is formed of the same non-conductive elastic material (e.g., tangoblack) as the first frame member no and the second frame member 210. According to another embodiment of the present disclosure, the helical spring member is capable of being formed of a different material from the first frame member and the second frame member.

In the above-described and illustrated embodiments of the present disclosure, the helical spring member 310 is used as an example of the stretching element 300, but, according to another embodiment of the present disclosure, an elastic member such as an elastic corrugated pipe is usable instead of the helical spring member.

In addition, the thermoelectric module 10 includes an electrode member 400 electrically connecting one end of the first thermoelectric material 100 to one end of the second thermoelectric material 200.

The first thermoelectric material 100 and the second thermoelectric material 200 are electrically connected to each other via the electrode member 400 to constitute the unit thermoelectric material.

Preferably, the electrode member 400 is provided to be stretchable between the first thermoelectric material 100 and the second thermoelectric material 200.

The electrode member 400 may be formed in various structures having elasticity, and the present disclosure is not limited or restricted by the structure of the electrode member 400.

As an example, the electrode member 400 may include a wire-shaped crest portion 410, and a wire-shaped trough portion 420 connected to an end of the wire-shaped crest portion 410 to form a continuous waveform with the wire-shaped crest portion 410.

The wire-shaped crest portion 410 and the wire-shaped trough portion 420 may be elastically opened or contracted in response to the relative movement of the second thermoelectric material 200 (the second frame member) with respect to the first thermoelectric material 100 (the first frame member).

As above-described, bending, torsion, and expansion of the second thermoelectric material 200 with respect to the first thermoelectric material 100 may be allowed, and the electrode member 400 may be allowed to have stretchable flexibility to improve the elasticity and flexibility of the thermoelectric module 10. Therefore, damage and breakage of the electrode member 400 due to the relative movement of the second thermoelectric material 200 with respect to the first thermoelectric material 100 may be minimized and durability may be improved.

Meanwhile, referring to FIGS. 6 and 7, according to a preferred embodiment of the present disclosure, the thermoelectric module 10 includes a piezoresistive pressure sensor 500 to connect the other ends of the first thermoelectric material 100 and the second thermoelectric material 200 to each other. Furthermore, when an external force is applied to the piezoresistive pressure sensor 500, the first thermoelectric material 100 and the second thermoelectric material 200 may be electrically connected to each other via the piezoresistive pressure sensor 500.

This is to actively implement temperature control of the thermoelectric module 10 without using an additional control unit.

Conventionally, as an entire area of the thermoelectric module 10 is controlled to a uniform temperature by a control signal of a control unit regardless of whether or not a user's body is contacted, the temperature control is performed even in an area (e.g., a non-contact area where the body does not touch) which does not require actual temperature control, and thus there is a problem that heat loss inevitably occurs and unnecessary power consumption increases.

In addition, conventionally, an additional control unit for controlling the temperature of the thermoelectric module 10 is provided, and thus there is a problem that a structure is complicated and a manufacturing cost is increased.

However, in embodiments of the present disclosure, when the external force is applied to the piezoresistive pressure sensor 500, the unit thermoelectric including the first thermoelectric material 100 and the second thermoelectric material 200 may be electrically connected and operated (heated or cooled) via the piezoresistive pressure sensor 500, and thus a control structure of the thermoelectric module 10 may be simplified and the temperature of the thermoelectric module 10 may be controlled without using an additional control unit.

In addition, in embodiments of the present disclosure, local temperature control of the thermoelectric module 10 may be performed depending on a body shape and posture of a user, and thus heat loss may be minimized and power consumption may be significantly lowered.

Therefore, the temperature control of the thermoelectric module 10 is not performed generally over the entire area, but the temperature control of only a specific area where actual contact depending on use environment (e.g., the user's body shape and posture) is made may be performed independently, and therefore the temperature control efficiency and the energy efficiency of the thermoelectric module 10 may be improved.

More specifically, the piezoresistive pressure sensor 500 is disposed on the electrode member 400 and is provided to selectively connect the other end of the first thermoelectric material 100 to the other end of the second thermoelectric material 200.

A general decompression element in which resistance changes when a pressure is applied may be used as the piezoresistive pressure sensor 500 and the present disclosure is not limited or restricted by the type and structure of the piezoresistive pressure sensor 500.

When no external force is applied to the piezoresistive pressure sensor 500, the electrical connection of the first thermoelectric material 100 and the second thermoelectric material 200 is blocked due to the high resistance of the piezoresistive pressure sensor 500. Therefore, the unit thermoelectric material including the first thermoelectric material 100 and the second thermoelectric material 200 does not operate.

On the other hand, when an external force is applied to the piezoresistive pressure sensor 500, the resistance of the piezoresistive pressure sensor 500 is reduced and the first thermoelectric material boo and the second thermoelectric material 200 are electrically connected to each other. The unit thermoelectric material including the first thermoelectric material 100 and the second thermoelectric material 200 operates.

In addition, the resistance of the piezoresistive pressure sensor 500 may be varied depending on strength of the external force applied to the piezoresistive pressure sensor 500 and degree of heating or cooling of the unit thermoelectric material may be actively controlled depending on the strength of the external force applied to the piezoresistive pressure sensor 500. For example, the unit thermoelectric material may be further operated (heated or cooled) in the area where the user's body is in further contact. Accordingly, temperature distribution may vary depending on pressure distribution based on the degree of the user's body contact.

Figure 8:
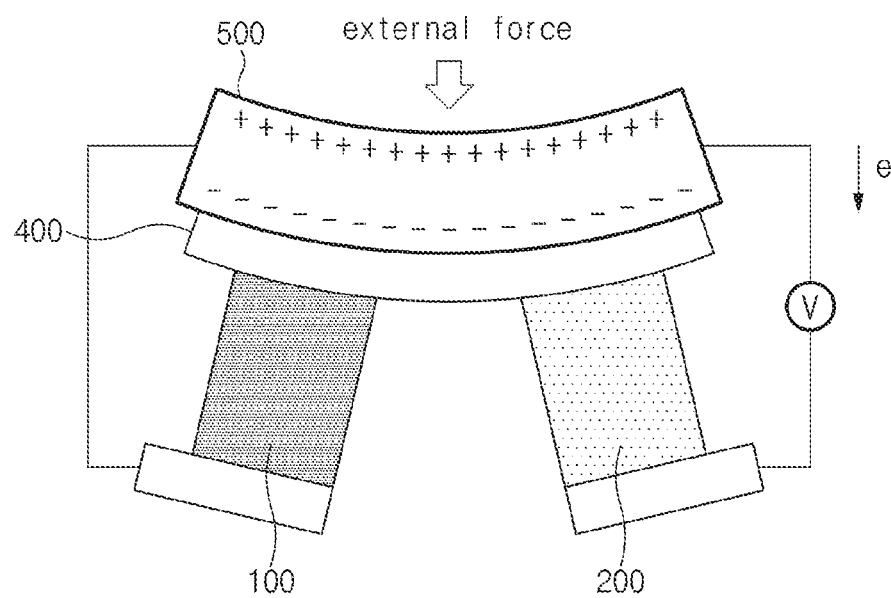
FIG. 8 is a view illustrating an example of a deformation when an external force is applied vertically to the thermoelectric module of FIG. 6.
Figure 9:
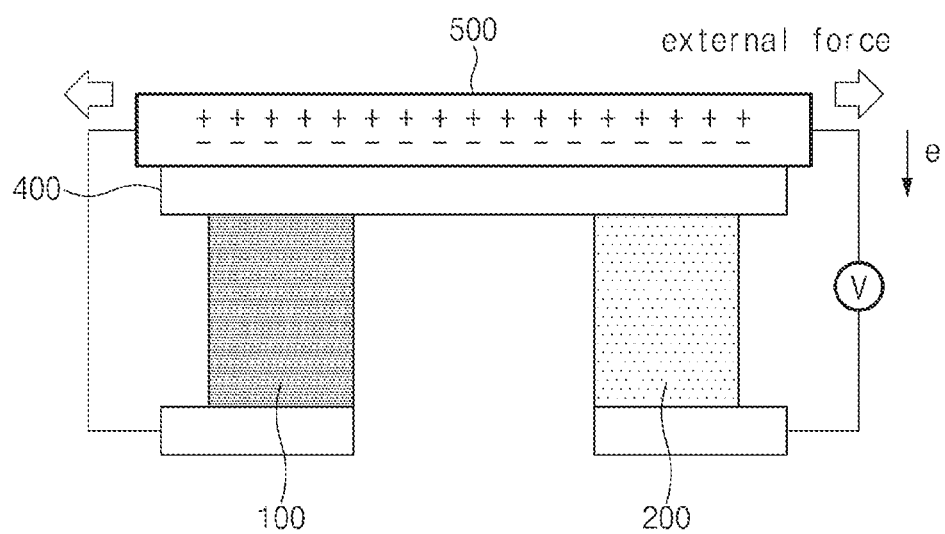
FIG. 9 is a view illustrating an example of a deformation when an external force is applied horizontally to the thermoelectric module of FIG. 6.

Meanwhile, because the thermoelectric module 10 of the present embodiment has a structure excellent in flexibility and elasticity, the thermoelectric module 10 may be modified as shown in FIG. 8 or 9 when the external force is applied, and thus impact on the operation of the thermoelectric module 10 may be small although the module is deformed by the external force. FIG. 8 is a view illustrating an example of a deformation when an external force is applied vertically to the thermoelectric module of FIG. 6, and FIG. 9 is a view illustrating an example of a deformation when an external force is applied horizontally to the thermoelectric module of FIG. 6.

As described above, according to embodiments of the present disclosure, an advantageous effect of improving the flexibility and elasticity may be obtained.

In particular, according to embodiments of the present disclosure, the thermoelectric module may be freely bent or stretched in response to the external pressure.

In addition, according to embodiments of the present disclosure, advantageous effects of improving the stability, reliability, and durability may be obtained.

In addition, according to embodiments of the present disclosure, advantageous effects of simplifying the control structure and controlling the temperature of the thermoelectric module without using an additional control unit may be obtained.

In addition, according to embodiments of the present disclosure, advantageous effects of improving the temperature control efficiency, energy efficiency, and comfort of the occupants may be obtained.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A thermoelectric module comprising:
   a first thermoelectric material;
   a second thermoelectric material spaced apart from the first thermoelectric material;
   a stretchable element selectively connected between the first thermoelectric material and the second thermoelectric material;
   an electrode member electrically connecting a first end of the first thermoelectric material to a first end of the second thermoelectric material; and
   a piezoresistive pressure sensor connecting a second end of the first thermoelectric material to a second end of the second thermoelectric material, such that when an external force is applied to the piezoresistive pressure sensor, the first thermoelectric material is electrically connected to the second thermoelectric material through the piezoresistive pressure sensor.

2. The thermoelectric module of claim 1, wherein the electrode member is stretchable between the first thermoelectric material and the second thermoelectric material.

3. The thermoelectric module of claim 2, wherein the electrode member comprises:
   a wire-shaped crest portion; and
   a wire-shaped trough portion connected to the wire-shaped crest portion to form a continuous waveform with the wire-shaped crest portion.

4. The thermoelectric module of claim 1, wherein the first thermoelectric material or the second thermoelectric material is any one of an N-type thermoelectric material or a P-type thermoelectric material.

5. A thermoelectric module comprising:
   a first thermoelectric material;
   a second thermoelectric material spaced apart from the first thermoelectric material;
   a first frame member in which the first thermoelectric material is accommodated;
   a second frame member in which the second thermoelectric material is accommodated; and
   a stretching element stretchably disposed between the first frame member and the second frame member with a first end connected to the first frame member and a second end connected to the second frame member, wherein the stretching element includes a helical spring member.

6. The thermoelectric module of claim 5, wherein the helical spring member is formed in a unitary unit with the first frame member and the second frame member.

7. The thermoelectric module of claim 6, wherein the first frame member, the second frame member, and the helical spring member are formed by 3D printing.

8. The thermoelectric module of claim 5, wherein the helical spring member is formed of a non-conductive elastic material.

9. A vehicle seat comprising:
   a bottom seat;
   a backrest seat connect to the bottom seat;
   a thermoelectric module mounted on the bottom seat or the backrest seat, the thermoelectric module comprising:

a first thermoelectric material;
a second thermoelectric material spaced apart from the first thermoelectric material;
a first frame member in which the first thermoelectric material is accommodated;
a second frame member in which the second thermoelectric material is accommodated; and
a stretching element selectively connected between the first thermoelectric material and the second thermoelectric material, the stretching element includes a helical spring member, wherein the stretching element is stretchably disposed between the first frame member and the second frame member with a first end connected to the first frame member and a second end connected to the second frame member.

10. The vehicle seat of claim 9, wherein:
the helical spring member is formed in a unitary unit with the first frame member and the second frame member; and
the first frame member, the second frame member, and the helical spring member are formed by 3D printing.

11. The vehicle seat of claim 9, wherein the helical spring member comprises a non-conductive elastic material.

12. The vehicle seat of claim 9, further comprising an electrode member electrically connecting a first end of the first thermoelectric material to a first end of the second thermoelectric material.

13. The vehicle seat of claim 12, wherein the electrode member comprises:
a wire-shaped crest portion; and
a wire-shaped trough portion connected to the wire-shaped crest portion to form a continuous waveform with the wire-shaped crest portion, wherein the electrode member is stretchable between the first thermoelectric material and the second thermoelectric material.

14. The vehicle seat of claim 9, wherein:
the first thermoelectric material is either a first N-type thermoelectric material or a first P-type thermoelectric material;
the second thermoelectric material is either a second N-type thermoelectric material or a second P-type thermoelectric material;
the first N-type thermoelectric material and the second N-type thermoelectric material may be a same material or a different material; and
the first P-type thermoelectric material and the second P-type thermoelectric material may be a same material or a different material.

15. The vehicle seat of claim 12, wherein the electrode member comprises:
a wire-shaped crest portion; and
a wire-shaped trough portion connected to the wire-shaped crest portion to form a continuous waveform with the wire-shaped crest portion, wherein the electrode member is stretchable between the first thermoelectric material and the second thermoelectric material.

16. A vehicle seat comprising:
a bottom seat;
a backrest seat connect to the bottom seat;
a thermoelectric module mounted on the bottom seat or the backrest seat, the thermoelectric module comprising:
a first thermoelectric material;
a second thermoelectric material spaced apart from the first thermoelectric material;
a stretching element selectively connected between the first thermoelectric material and the second thermoelectric material;
an electrode member electrically connecting a first end of the first thermoelectric material to a first end of the second thermoelectric material; and
a piezoresistive pressure sensor connecting a second end of the first thermoelectric material to a second end of the second thermoelectric material, wherein, when an external force is applied to the piezoresistive pressure sensor, the first thermoelectric material is electrically connected to the second thermoelectric material through the piezoresistive pressure sensor.

17. The vehicle seat of claim 16, wherein the thermoelectric module further comprises:
a first frame member in which the first thermoelectric material is accommodated; and
a second frame member in which the second thermoelectric material is accommodated,
wherein the stretching element is stretchably disposed between the first frame member and the second frame member with a first end connected to the first frame member and a second end connected to the second frame member.

18. The vehicle seat of claim 17, wherein the stretching element includes a helical spring member.

19. The vehicle seat of claim 18, wherein:
the helical spring member is formed in a unitary unit with the first frame member and the second frame member; and
the first frame member, the second frame member, and the helical spring member are formed by 3D printing.

20. The vehicle seat of claim 18, wherein the helical spring member comprises a non-conductive elastic material.

* * * * *